US007650580B2

(12) United States Patent
Kucukcakar et al.

(10) Patent No.: US 7,650,580 B2
(45) Date of Patent: Jan. 19, 2010

(54) METHOD AND APPARATUS FOR DETERMINING THE PERFORMANCE OF AN INTEGRATED CIRCUIT

(75) Inventors: Kayhan Kucukcakar, Sunnyvale, CA (US); Ali Dasdan, San Jose, CA (US); Halim Damerdji, Los Altos, CA (US)

(73) Assignee: Synopsys, Inc., Mountain View, CA (US)

( * ) Notice: Subject to any disclaimer, the term of this patent is extended or adjusted under 35 U.S.C. 154(b) by 406 days.

(21) Appl. No.: 11/644,563

(22) Filed: Dec. 21, 2006

(65) Prior Publication Data

US 2007/0156367 A1    Jul. 5, 2007

Related U.S. Application Data

(60) Provisional application No. 60/756,242, filed on Jan. 3, 2006.

(51) Int. Cl.
*G06F 17/50*    (2006.01)
*G06F 17/10*    (2006.01)
*G06F 19/00*    (2006.01)
*G01R 27/08*    (2006.01)
*G01R 31/00*    (2006.01)

(52) U.S. Cl. .................. 716/6; 703/2; 703/16; 702/83; 702/118; 702/179; 702/180; 702/181

(58) Field of Classification Search ................ 716/4, 716/5, 6; 703/2, 16; 702/83, 118, 179, 180, 702/181
See application file for complete search history.

(56) References Cited

U.S. PATENT DOCUMENTS 4,791,578 A * 12/1988 Fazio et al. .................... 716/4
6,304,836 B1 * 10/2001 Krivokapic et al. ........... 703/14
7,142,991 B2 * 11/2006 Hathaway et al. ............. 702/57

OTHER PUBLICATIONS

Lawson, "Quantitative Data for Design Models", Sixteenth IEEE/CPMT International Electronics Manufacturing Technology Symposium, vol. 1, Sep. 12-14, 1994, pp. 212-215.*

* cited by examiner

*Primary Examiner*—Phallaka Kik
(74) *Attorney, Agent, or Firm*—Park, Vaughan & Fleming LLP

(57) ABSTRACT

A system that determines the performance of an integrated circuit (IC). During operation, the system receives probability distributions for parameters for the IC. Next, the system generates samples of the IC, wherein generating a given sample involves using the probability distribution to assign values to the parameters for components within the IC. The system then calculates output performance metrics for the samples based on the assigned values of the parameters, and uses the calculated output performance metrics to generate a distribution of output performance metrics for the samples.

41 Claims, 11 Drawing Sheets

METHOD AND APPARATUS FOR DETERMINING THE PERFORMANCE OF AN INTEGRATED CIRCUIT

RELATED APPLICATION

This application hereby claims priority under 35 U.S.C. §119 to U.S. Provisional Patent Application No. 60/756,242 filed 3 Jan. 2006, entitled "Method and Apparatus to Improve Static Timing and Power Analysis Accuracy by Accurate Modeling of Variations," by inventors Kayhan Kucukcakar, Ali Dasdan, and Halim Damerdji.

BACKGROUND

1. Field of the Invention

The present invention relates to techniques for determining the performance of an integrated circuit. More specifically, the present invention relates to a method and apparatus for accounting for the statistical distribution of performance-related parameters while determining the performance of an integrated circuit.

2. Related Art

Static timing analysis (STA) is often used to compare the performance of a circuit against the desired performance metrics. If the desired performance characteristics are not met, the circuit is typically redesigned and STA is rerun. FIG. 1 presents a block diagram illustrating the process of determining the timing for a circuit, which includes flip-flops 101-102, a number of gates, and a clock signal 100, which has a period $t_P$. Launch path 103 is the path from clock signal 100 to the clock input of flip-flop 101, and $t_L$ is the time required for a signal to traverse launch path 103. Capture path 104 is the path from clock signal 100 to the clock input of flip-flop 102, and $t_C$ is the time required for a signal to traverse capture path 104. Data path 105 is the path from the "Q" output of flip-flop 101 to the "D" input of flip-flop 102, and $t_D$ is the time required for a signal to traverse data path 105.

In FIG. 1, the setup and hold slacks are evaluated at flip-flop 102. Flip-flop 102 has a setup time requirement of $t_{SETUP}$ and a hold time requirement of $t_{HOLD}$. Hence, the setup slack and hold slacks are:

setup slack=min($t_C+t_P$)−max($t_L+t_D+t_{SETUP}$)

hold slack=min($t_L+t_D$)−max($t_C+t_{HOLD}$).

While performing STA, variations in the parameters for an integrated circuit (IC) manufacturing process need to be taken into account. One technique to account for such variations is to use bounding techniques while performing STA. FIG. 2 presents a block diagram illustrating the process of calculating the timing for a circuit using such a bounding technique. The circuit in FIG. 2 includes gates 200-202 wherein the worst-case timing of each gate is between 1-2 time units. After a signal passes through gate 200, the signal arrives at the output of gate 200 a minimum of 1 time unit and a maximum of 2 time units after entering gate 200. After the signal passes through gate 201, the signal arrives at the output of gate 201 a minimum of 2 time units and a maximum of 4 time units after entering gate 200. After the signal passes through gate 202, the signal arrives at the output of gate 202 a minimum of 3 time units and a maximum of 6 time units after entering gate 200. Note that the above-described timing analysis technique uses the worst-case timing for each gate, which results in safe timing, but physically improbable.

Unfortunately, increasing clock frequencies are making it more difficult to meet timing constraints. This problem is magnified by the overly-pessimistic worst-case timing analysis techniques used in present STA techniques.

One solution to this problem is to use a statistical technique to calculate the timing for a circuit. FIG. 3 presents a block diagram illustrating the process of calculating the worst-case timing for a circuit using such a statistical technique. The circuit includes gates 300-302 wherein the worst-case timing of each gate is represented as a distribution of possible timings wherein the minimum is 1 time unit and the maximum is 2 time units. After a signal passes through gate 300, the distribution of arrival times for the signal at the output of gate 300 is a minimum of 1 time unit and a maximum of 2 time units after entering gate 300. After the signal passes through gate 301, the distribution of arrival times for the signal at the output of gate 301 is a minimum of 2.45 time units and a maximum of 3.65 time units after entering gate 300. After the signal passes through gate 302, the distribution of arrival times for the signal at the output of gate 302 is a minimum of 3.75 time units and a maximum of 5.25 time units after entering gate 300. Note that this technique provides a more accurate view of the timing of the circuit and is less pessimistic than the bounding technique. Unfortunately, performing statistical STA (SSTA) in this way is computationally costly because operations performed on variation probability distributions are resource-intensive. Furthermore, if the variations are correlated to one another, finding an acceptable solution becomes even more complex and time consuming. Note that correlated variation distribution functions are distribution functions that are statistically dependent, whereas uncorrelated variation distribution functions are statistically independent.

Hence, what is needed is a method and an apparatus for determining the performance of an IC without the problems described above.

SUMMARY

One embodiment of the present invention provides a system that determines the performance of an integrated circuit (IC). During operation, the system receives probability distributions for parameters for the IC. Next, the system generates samples of the IC, wherein while generating a given sample, the system uses the probability distributions to assign values to the parameters for components within the IC. The system then calculates output performance metrics for the samples based on the assigned values of the parameters, and uses the calculated output performance metrics to generate a distribution of output performance metrics for the samples.

In a variation on this embodiment, the probability distributions are discrete distributions and the discretization points for parameters are associated with the samples.

In a further variation, a single analysis is used to calculate the output performance metrics for the samples, wherein data from a given sample is not mixed with data from other samples.

In a further variation, the system adjusts the discretization to achieve a specified accuracy and a specified performance.

In a variation on this embodiment, the output performance metrics can include: delay; slew; noise; power; signal integrity; arrival time; required time; and slack.

In a variation on this embodiment, the system generates a report which can include one or more of: a plot of the distribution of the input parameters; the mean of the input parameters; the standard deviation of the input parameters; the sensitivity of the input parameters; the value of the input parameters at a specified quantile; the distribution of the calculated output performance metrics; the mean of the calculated output performance metrics; the standard deviation of the calculated output performance metrics; the sensitivity of the calculated output performance metrics; the sensitivity of the input performance metrics; the value of the output performance metric at a specified quantile; the probability that the output performance metric is at, above or below a specified value; and any other report metric.

In a variation on this embodiment, the system receives one or more of properties of the parameters, wherein the one or more properties can include: variational constraints for the parameters; auto-correlations for the parameters; cross-correlations for the parameters; spatial correlations for the parameters; the mean shift of the parameter for each device or interconnect; the sensitivity of devices to the parameters; the sensitivity of interconnects to the parameters; and any other property of a parameter. The system then generates the samples of the IC using the probability distribution and the one or more properties of the parameters.

In a further variation, a variational constraint for the parameters can include one or more of: an input delay; an output delay; a setup constraint; a hold constraint; a clock insertion delay; a clock skew; a clock uncertainty; and any other variational constraint.

In a further variation, a spatial correlation can include: a grid-based correlation; a map-based correlation (e.g., temperature map); a distance-based correlation; and any other type of spatial correlation.

In a further variation, the sensitivity of devices to the parameters can include one or more of sensitivities to: delay; slew; capacitance; signal bump height; signal bump width; leakage current; drive resistance; output current; and any other sensitivity parameter.

In a further variation, the sensitivity of interconnect to the parameters can include one or more of sensitivities to: metal thickness; metal width; metal spacing; interlayer dielectric thickness; contact size; via size; temperature; and any other sensitivity parameter.

In a further variation, sensitivities to device and/or interconnect variations can be specified for one or more of: rising timing arcs for devices; falling timing arcs for devices; linear approximation; piece-wise linear approximation; slew-segmented linear; slew-segmented piece-wise linear; load-segmented linear; and load-segmented piece-wise linear.

In a variation on this embodiment, the parameters can be applied to components of the IC within one or more of: a timing arc; a cell; an interconnect segment; a set of timing arcs; a set of cells; a set of interconnect segments; a portion of the IC which includes cells and interconnect; and any other component of the IC.

In a variation on this embodiment, the probability distributions can include one or more of: a normal distribution; a log-normal distribution; a uniform distribution; a constant distribution; a multiple discrete value distribution; a piecewise-linear distribution; an empirical distribution; and any other probability distribution.

In a variation on this embodiment, the parameters can include one or more of: metal parameters; transistor parameters; dielectric parameters; and any other device parameter.

In a variation on this embodiment, annotations can be used.

In a variation on this embodiment, the system predicts a probability of failure for a manufactured IC by: identifying paths that do not meet specified requirements for the output performance metrics; obtaining discrete distribution functions for the identified paths; and performing a statistical minimum function for the discrete distribution functions for the paths to produce a minimum distribution function, which indicates the probability of failure for the manufactured IC.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer readable media now known or later developed.

Flow Summary and Context

Figure 1:
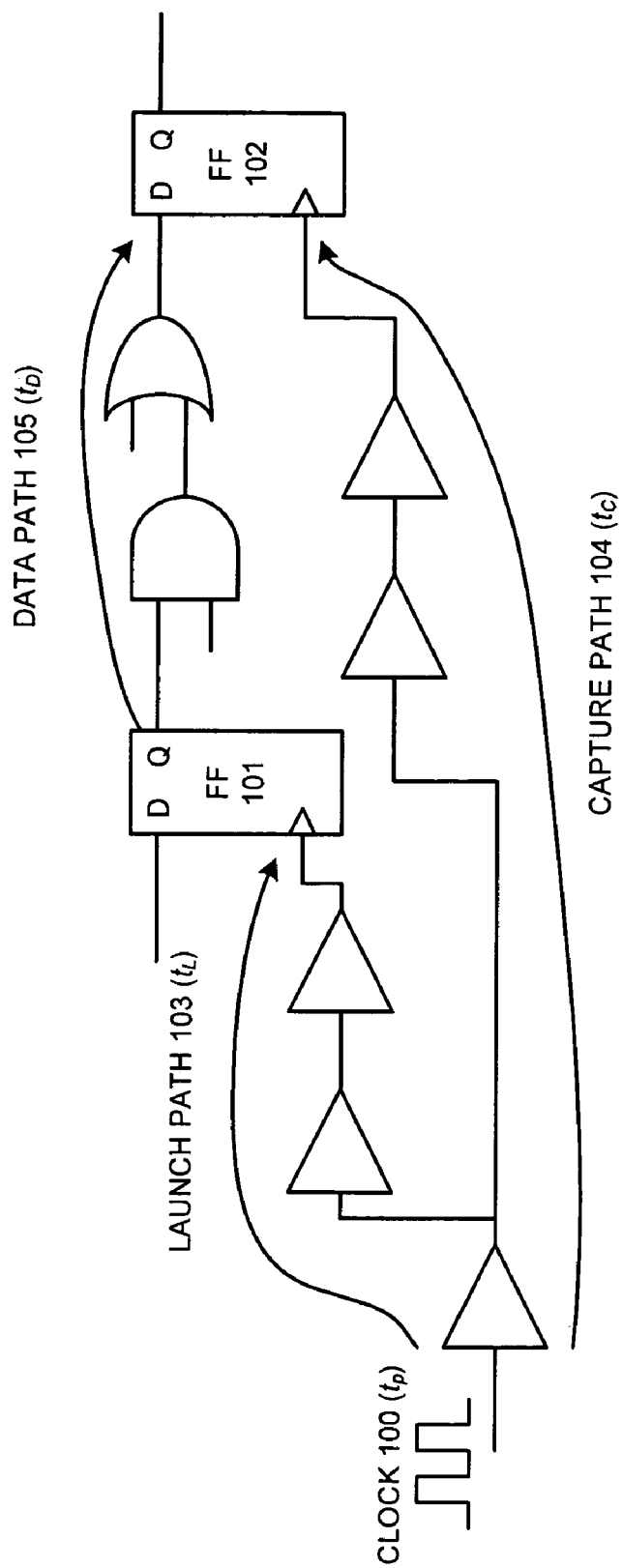
FIG. 1 presents a block diagram illustrating the process of determining the timing for a circuit.
Figure 2:
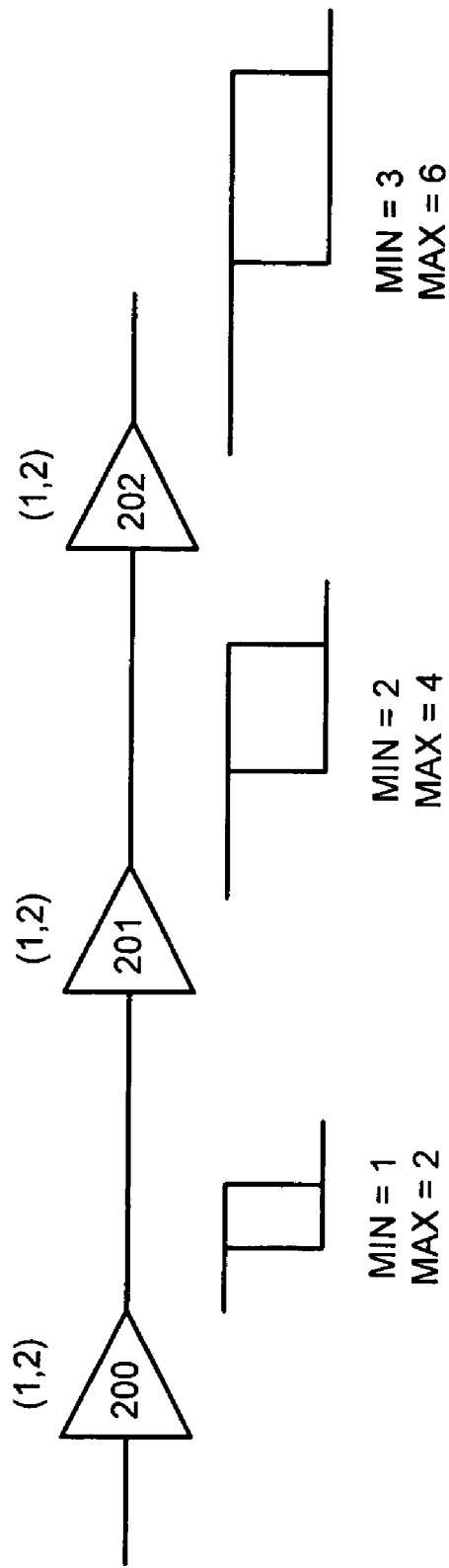
FIG. 2 presents a block diagram illustrating the process of calculating the timing for a circuit using a bounding technique.
Figure 3:
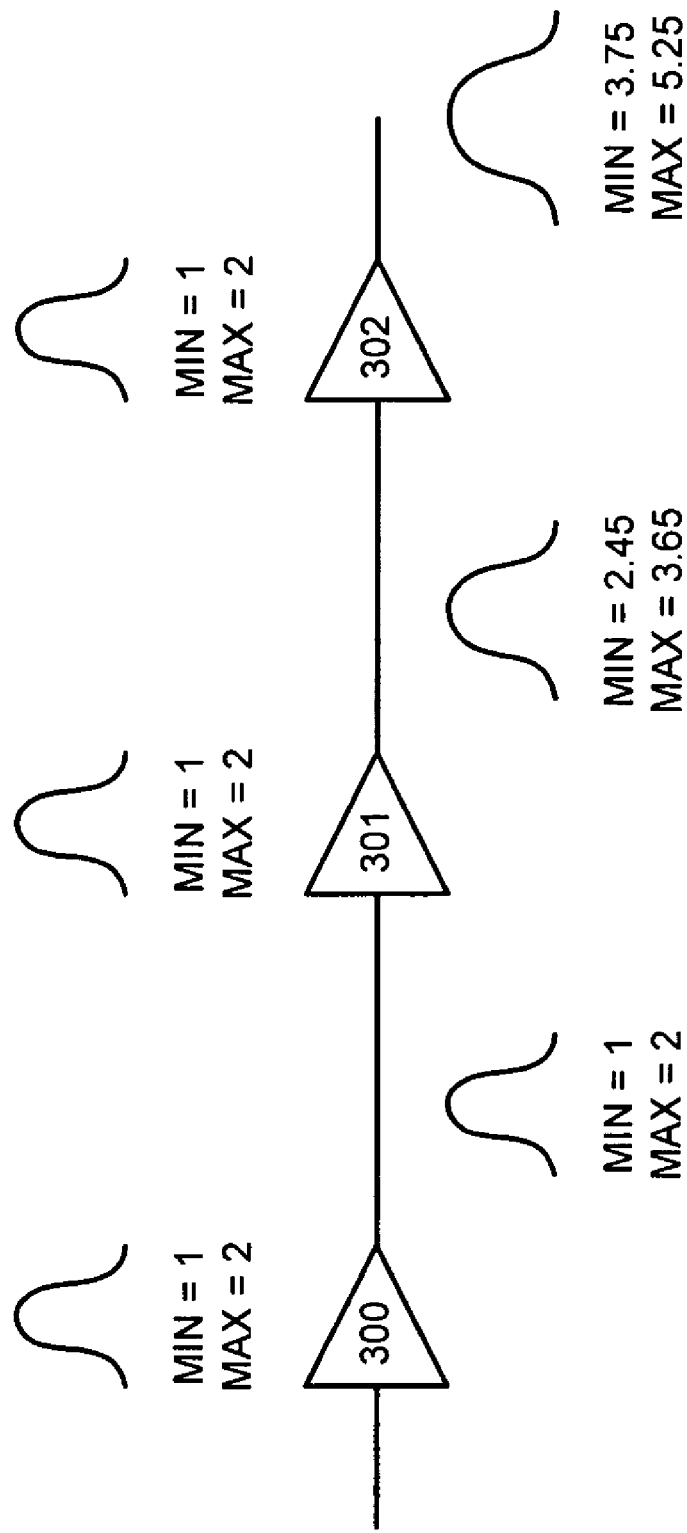
FIG. 3 presents a block diagram illustrating the process of calculating the timing for a circuit using a statistical technique.
Figure 4:
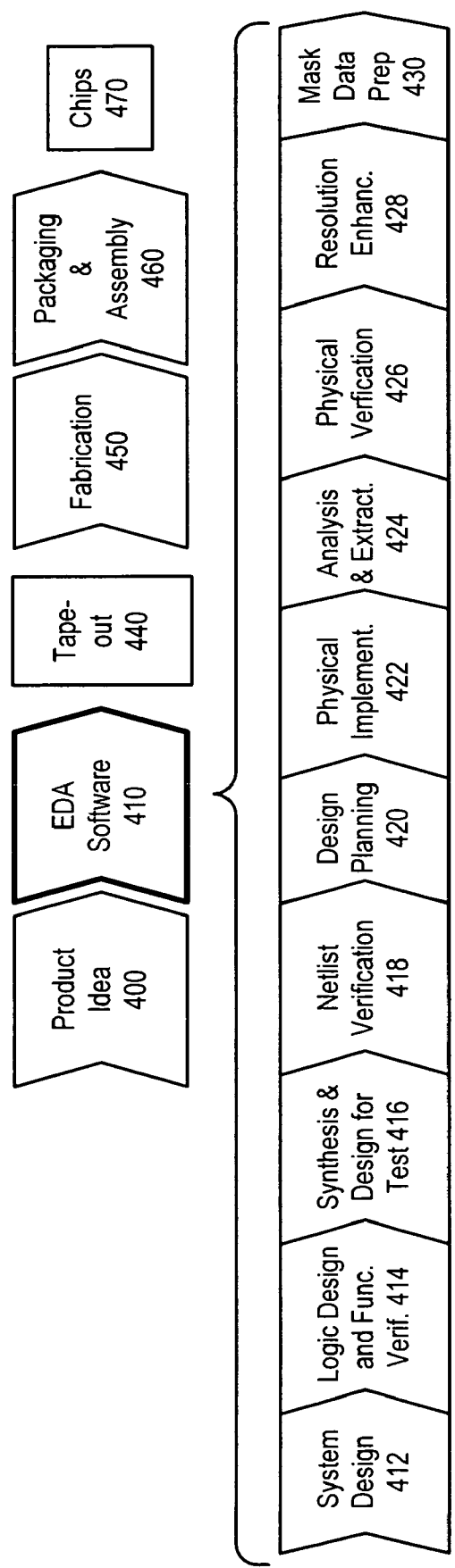
FIG. 4 presents a simplified representation of an exemplary digital ASIC design flow.

Before proceeding further with the description, it may be helpful to place this process in context. FIG. 4 presents a simplified representation of an exemplary digital ASIC design flow. At a high level, the process starts with the product idea (step 400) and is realized in an EDA software design process (step 410). When the design is finalized, it can be taped-out (event 440). After tape out, the fabrication process (step 450) and packaging and assembly processes (step 460) occur resulting, ultimately, in finished chips (result 470).

The EDA software design process (step 410) is actually composed of a number of steps 412-430, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step 410) will now be provided.

System design (step 412): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber®, System Studio, and DesignWare® products. Note that Saber is a registered trademark of SabreMark Limited Partnership.

Logic design and functional verification (step 414): At this stage, the VHDL, Verilog, or SystemVerilog code for modules in the system is written and the design is checked for functional accuracy. More specifically, does the design as checked to ensure that produces the correct outputs. Exemplary EDA software products from Synopsys, Inc. that can be used at this step include VCS®, VERA®, DesignWare®, Magellan™, Formality®, ESP and LEDA® products.

Synthesis and design for test (step 416): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler®, Test Compiler, Power Compiler™, FPGA Compiler, Tetramax®, and DesignWare® products.

Netlist verification (step 418): At this step, the netlist is checked for compliance with timing constraints and for correspondence with the VHDL/Verilog source code. Exemplary EDA software products from Synopsys, Inc. that can be used at this step include Formality, PrimeTime, and VCS products. Note that the present invention is directed to improving timing analysis.

Design planning (step 420): Here, an overall floorplan for the chip is constructed and analyzed for timing and top-level routing. Exemplary EDA software products from Synopsys, Inc. that can be used at this step include Astro™ and IC Compiler products.

Physical implementation (step 422): The placement (positioning of circuit elements) and routing (connection of the same) occurs at this step. Exemplary EDA software products from Synopsys, Inc. that can be used at this step include the Astro and IC Compiler products.

Analysis and extraction (step 424): At this step, the circuit function is verified at a transistor level, this in turn permits what-if refinement. Exemplary EDA software products from Synopsys, Inc. that can be used at this step include Astro-Rail™, PrimeRail, PrimeTime®, and Star RCXT™ products.

Physical verification (step 426): At this step various checking functions are performed to ensure correctness for: manufacturing, electrical issues, lithographic issues, and circuitry. Exemplary EDA software products from Synopsys, Inc. that can be used at this step include the Hercules™ product.

Resolution enhancement (step 428): This step involves geometric manipulations of the layout to improve manufacturability of the design. Exemplary EDA software products from Synopsys, Inc. that can be used at this step include Proteus, ProteusAF, and PSMGen products.

Mask data preparation (step 430): This step provides the "tape-out" data for production of masks for lithographic use to produce finished chips. Exemplary EDA software products from Synopsys, Inc. that can be used at this step include the CATS® family of products.

Note that VCS, VERA, DesignWare, Magellan, Formality, LEDA, Design Compiler, Physical Compiler, Power Compiler, Tetramax, DesignWare, Astro, Astro-Rail, PrimeTime, Star-RCXT, Hercules, and CATS are trademarks or registered trademarks of Synopsys, Inc. in the United States and other countries.

Overview

The goal of timing analysis is to determine whether a satisfactory number of chips will meet a specified timing constraint. Hence, one embodiment of the present invention improves the accuracy of static timing analysis by directly and accurately modeling variations in the parameters for an IC.

Standard STA can analyze the timing of an IC under a single set of variations (e.g., typical/nominal corner, slow corner, fast corner, etc.). However, standard STA cannot be used to compute the timing of the circuit wherein the timing of each component varies under arbitrary distribution functions, and also wherein the arbitrary distribution functions are correlated with each other.

Hence, one embodiment of the present invention performs STA for multiple "samples" of an IC, wherein each sample has a set of values for the parameters for the IC. In this embodiment, correlations are handled during the sample-creation process. Note that reconvergent paths (i.e., a correlation between paths) are already handled properly using standard STA techniques and do not need to be handled in a special manner using the present invention.

In one embodiment of the present invention, a distribution of timing results is created by aggregating results of timing analyses performed for the samples. This distribution is analyzed to determine whether the timing meets performance constraints.

More specifically, one embodiment of the present invention:

(1) handles variations in parameters for an IC, wherein the variations are represented by probability distributions;

(2) generates a plurality of samples wherein the values for the parameters are assigned so that the probability distribution of the parameters is substantially reproduced across the samples;

(3) performs STA on each sample; and (4) reports results by creating distributions using STA results of each sample.

One embodiment of the present invention can handle arbitrary delay distribution functions.

One embodiment of the present invention can handle correlations. These correlations can include one or more of: a correlation between the parameters, a time correlation (e.g., current, temperature cannot change instantaneously), a physical correlation (e.g., many nearby devices may be more similar than ones far apart), and a logical correlation (e.g., reconvergent fanout in the netlist).

One embodiment of the present invention facilitates the use of timing and power derating for parameters that are not directly modeled. Another embodiment of the present invention facilitates the use of random distributions for parameters that are not directly modeled.

Parameters

In one embodiment of the present invention, the parameters that are varied include one or more of: raw SPICE parameters (e.g., channel length, threshold voltage); controllable process parameters (e.g., gate oxidation temperature, halo implant dose); derived parameters (e.g., Principle Component Analysis-PCA).

Parameters that are to be varied should be selected with care because performance and accuracy is substantially affected by the choice of parameters. In one embodiment of the present invention, independent and dominant parameters can be selected based on experimentation. In another embodiment of the present invention, independent and dominant parameters can be previously known.

Note that derived parameters can be correlated. Hence, in one embodiment of the present invention, correlation is ignored if the error is small. In another embodiment of the present invention, the correlation between parameters is derived and used.

In one embodiment of the present invention, if there are too many parameters or if the parameters are correlated, the parameters are simplified using a PCA technique.

In one embodiment of the present invention, variations in parameters for an IC are modeled independently of the library modeling. In this embodiment, items such as points in the process, voltage, and temperature (PVT) space for the parameters, are chosen to model the behavior of a circuit as a function of the parameters. Note that by selecting appropriate points in the library, the PVT space can be accurately approximated. One embodiment of the present invention uses linear interpolation and extrapolation to model variations in parameters for an IC. Another embodiment of the present invention uses piecewise-linear interpolation and extrapolation to model variations in parameters for an IC.

In one embodiment of the present invention, a parameter can include multiple components. For example, the components can include one or more of: a fab-to-fab component, a lot-to-lot component, a die-to-die (inter-die) component, and an intra-die component. For example, a channel length parameter can have several components:

$$L = L_{nom} + \Delta L_{fab} + \Delta L_{lot} + \Delta L_{wafer} + \Delta L_{die} + \Delta L_{systematic}$$

where the channel length is equal to the sum of its nominal value and the variation components. Note that $\Delta L_{fab}$, $\Delta L_{lot}$, $\Delta L_{wafer}$, $\Delta L_{die}$, and $\Delta L_{systematic}$ are variations on top of $L_{nom}$. Also note that each component can have a different distribution.

Figure 5:
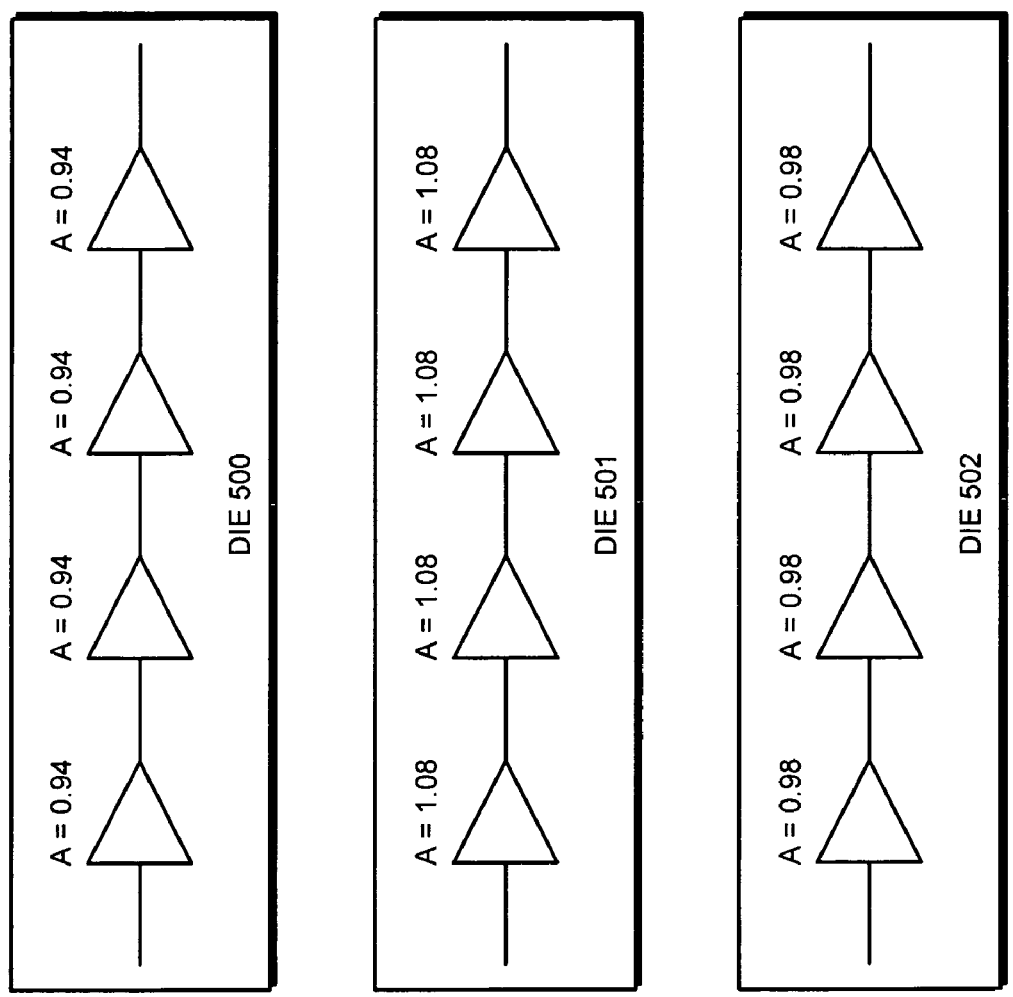
FIG. 5 presents a block diagram illustrating inter-die variations of a parameter in accordance with an embodiment of the present invention.

FIG. 5 presents a block diagram illustrating inter-die variations of a parameter A in accordance with an embodiment of the present invention. Inter-die variations are fully correlated within a given die, but vary between dies. For example, in FIG. 5, parameter A=0.95 in die 500, parameter A=1.08 in die 501, and parameter A=0.98 in die 502.

Figure 6:
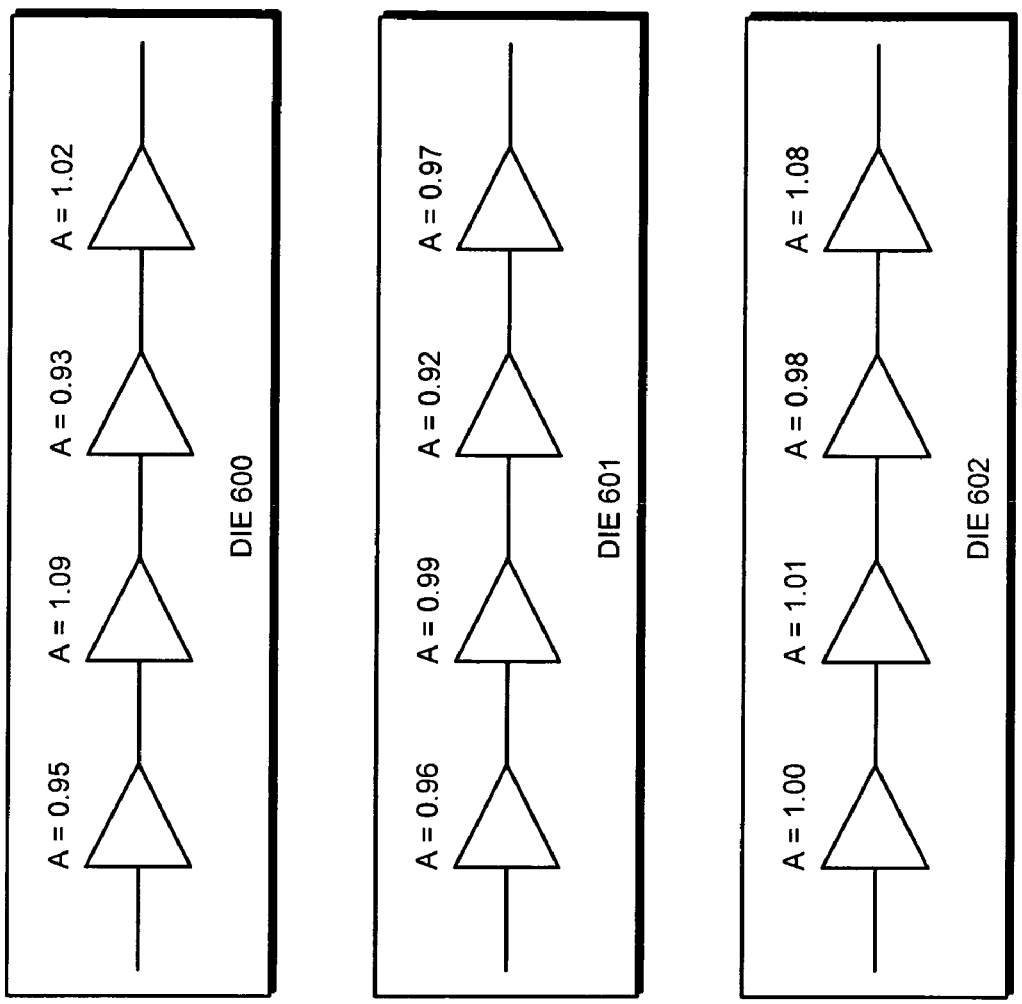
FIG. 6 presents a block diagram illustrating intra-die variations of a parameter in accordance with an embodiment of the present invention.

FIG. 6 presents a block diagram illustrating intra-die variations of a parameter A in accordance with an embodiment of the present invention. Intra-die variations can be correlated or can be independent within a given die. Hence, each device within a given die can have a different value for the parameter. For example, in FIG. 5, parameter A is {0.95, 1.09, 0.93, 1.02} for the four gates illustrated in die 600, parameter A is {0.96, 0.99, 0.92, 0.97} for the four gates illustrated in die 601, and parameter A is {1.00, 1.01, 0.98, 1.08} for the four gates illustrated in die 602.

Some parameters or components can be systematic or random. Systematic components can be determined by layout-aware tools such as parasitic extraction tools. If desired, systematic effects can be modeled as deterministic shifts in the nominal (or corner) values, leaving only random variations. One example of systematic variation modeling is density-dependent metal thickness.

One embodiment of the present invention models the sensitivity of resistances and capacitances to variations in the parameters for an IC without making assumptions about the distribution associated with a parameter. In this embodiment, the timing and/or power analyses are used to decide which distributions to use and make accuracy/efficiency tradeoffs.

Parasitic Model

In one embodiment of the present invention, parameterized parasitics are created to model parasitic values as a function of varying parameter values. For example, R and C can be functions of parasitic parameters such as metal width, length, thickness, and conductivity. In this embodiment, the models do not include information about the probability distributions for the parameters.

One embodiment of the present invention performs filtering based on resistances and capacitances, and/or sensitivities.

In one embodiment of the present invention, instead of using $RC_{max}$ and $RC_{min}$-type corners, bounding and realizable metal layer creation can be used to handle metal mismatch.

In one embodiment of the present invention, parameterized model order reduction can be used to improve analysis performance.

Delay Calculation

One embodiment of the present invention provides a number of "effort levels" to facilitate tradeoffs between accuracy and runtime. For example, these effort levels can include, but are not limited to, using: analytical techniques; sampling with interpolation over slew and load indices; and full-blown sampling.

One embodiment of the present invention supports both propagating arcs and constraining arcs.

In one embodiment of the present invention, parameterized driver models can be used to improve analysis performance of the analysis process.

Statistical STA

Figure 7A:
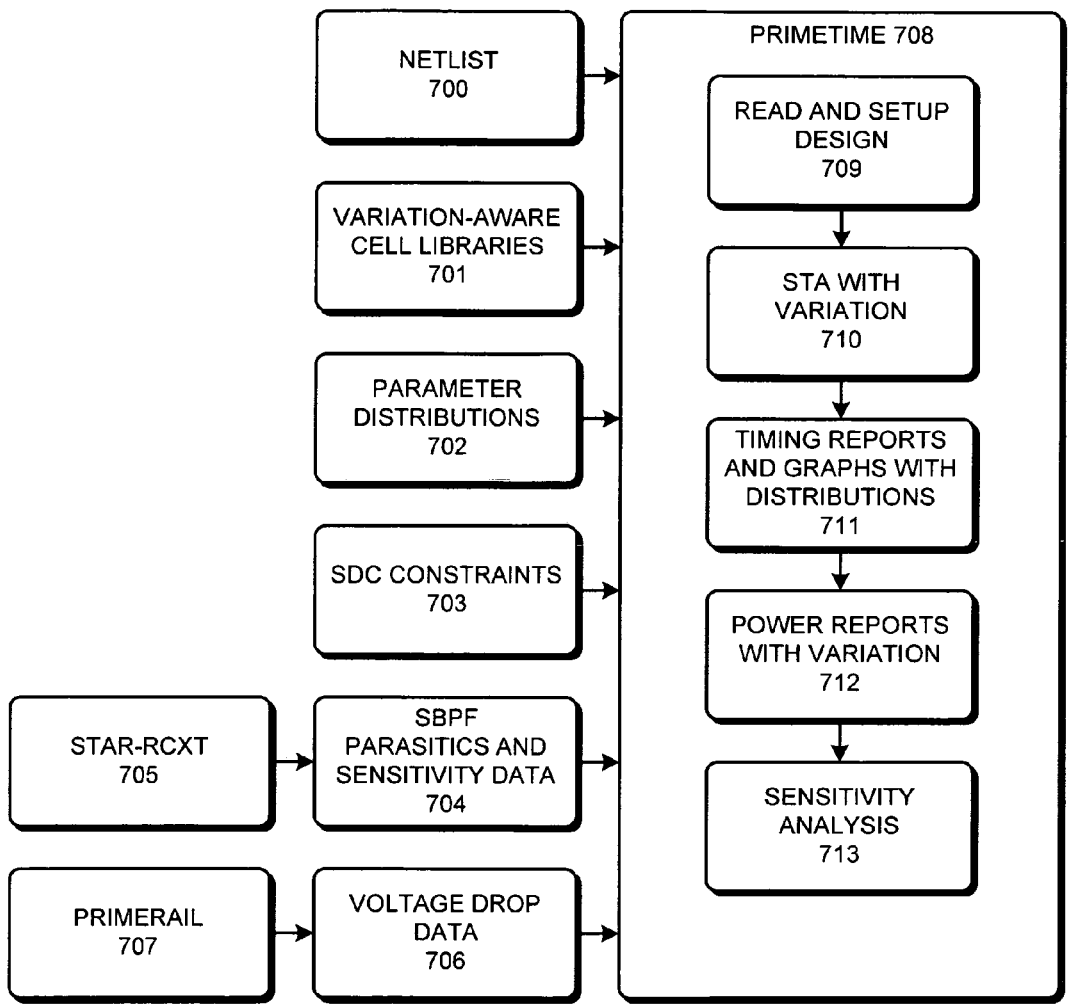
FIG. 7A presents a block diagram illustrating the variation-aware timing analysis flow in accordance with an embodiment of the present invention.

FIG. 7A presents a block diagram illustrating the variation-aware timing analysis flow in accordance with an embodiment of the present invention. In FIG. 7A, PrimeTime 708 receives a number of inputs and performs a number of operations on the inputs. In one embodiment of the present invention, PrimeTime 708 can be any timing analysis tool now known or later developed.

PrimeTime 708 receives: netlist 700, variation-aware cell libraries 701, parameter distributions 702, Synopsys Design Constraints (SDCs) 703, Synopsys Binary Parasitic Format (SBPF) parasitics and sensitivity data 704, and voltage drop data 706. In one embodiment of the present invention, SBPF parasitics and sensitivity data 704 is generated from Star-RCXT™ 705. In one embodiment of the present invention, voltage drop data 706 is generated by PrimeRail 707.

Note that SDC constraints 703 can be any type of design constraint now known or later developed. Furthermore, SBPF and parasitic sensitivity data 704 can be parasitic and sensitivity data in any format now known or later developed.

During timing analysis, PrimeTime 708 reads and sets up the design (block 709). Next, PrimeTime 708 performs STA with variations (block 710). PrimeTime 708 then generates timing reports and graphs which include distributions of timings (block 711). Next, PrimeTime 708 generates power reports which include the effects of variations (block 712). PrimeTime 708 then performs a sensitivity analysis (block 713). Note that the order of the steps performed by PrimeTime 708, as illustrated in FIG. 7A, is used for illustrative purposes only and can be modified without changing the operation of the present invention.

Figure 7B:
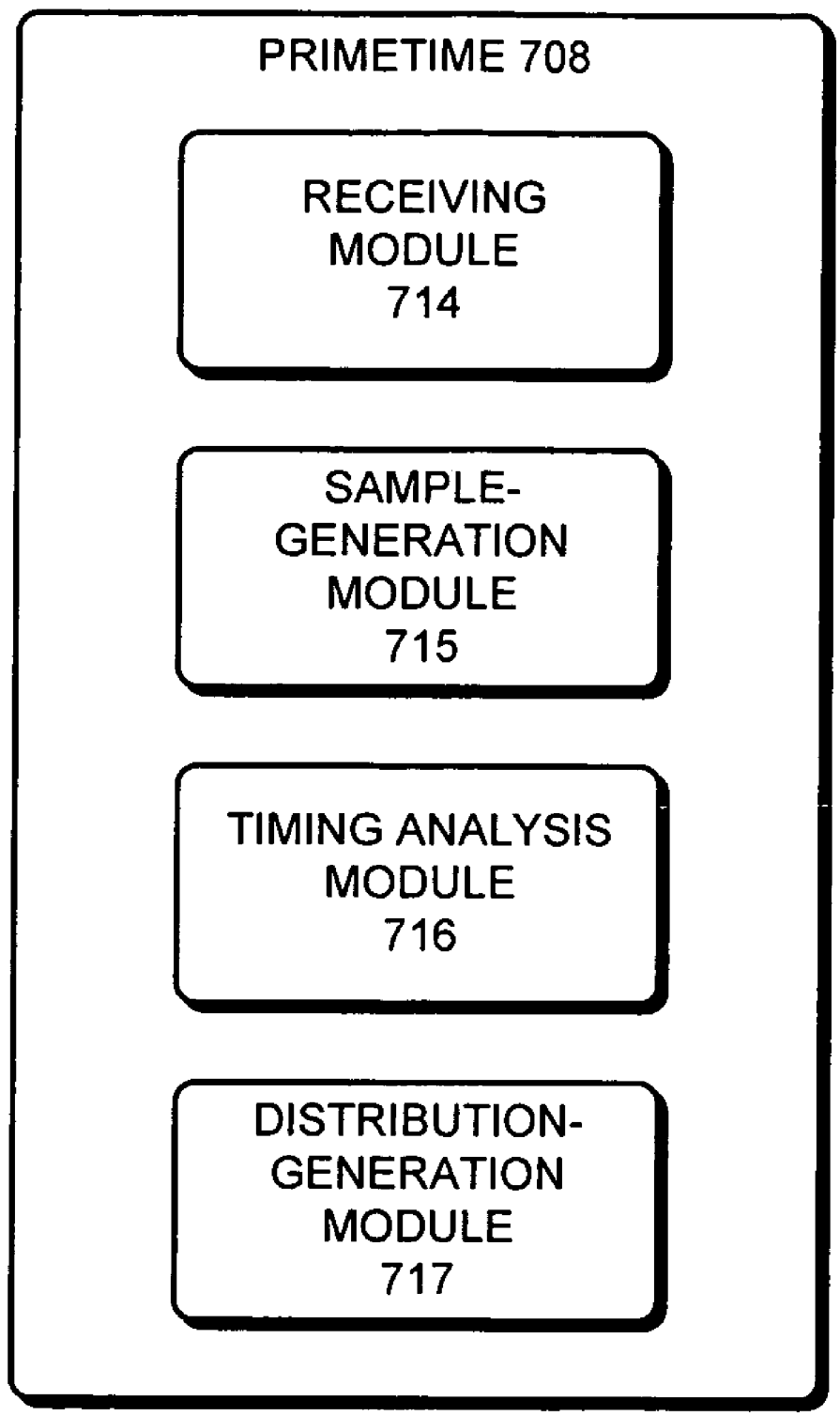
FIG. 7B presents a block diagram of a variation-aware timing analysis module in accordance with an embodiment of the present invention.

FIG. 7B presents a block diagram of PrimeTime 708, which includes receiving module 714, sample-generation module 715, timing analysis module 716, and distribution-generation module 717 in accordance with an embodiment of the present invention. Receiving module 714 is configured to receive probability distributions for parameters for the IC. Sample-generation module 715 is configured to generate samples of the IC, wherein for a given sample, sample-generation module 715 is configured to use the probability distribution to assign values to the parameters for components within the IC. Timing analysis module 716 is configured to calculate delays for the samples based on the assigned values of the parameters. Distribution-generation module 717 is configured to use the calculated delays to generate a distribution of delays for the samples.

Libraries

In one embodiment of the present invention, cell libraries do not contain information about parameter distributions. Hence, cell libraries can support process shift over time (i.e., distributions change) without affecting the library (i.e., no re-characterization). For example, if the parameter ranges shift, the library sampling points that are in the intersection of the old and new ranges are still valid to use in most cases. The sampling for the library points can accurately approximate the PVT space. One embodiment of the present invention post-processes library sampling points to further improve efficiency of the analysis.

Since each library point is a sample in PVT space, one embodiment of the present invention models non-linear delay models (NLDM) and composite current sources (CCS) independently.

One embodiment of the present invention samples library points within a specified value of the mean of the distributions for the parameters. For example, the parameters can be sampled at one standard deviation around the nominal/mean value for a parameter.

One embodiment of the present invention supports different variations with rising and falling senses on the same arc. This embodiment handles the p/n mismatch modeling and can replace the current fast-p/slow-n, slow-p/fast-n, fast-p/fast-n, and slow-p/slow-n, and typical-p/typical-n corners.

In one embodiment of the present invention, parameter values assigned to a cell arc (or a transistor path) per sense can be independent or can be correlated. For example, within a single cell, variations can be correlated between different senses on the same arc, or between the same or different sense on different arcs. Extensions of correlations between different cells are similarly allowed.

In one embodiment of the present invention, variations for parameters can be applied to devices, pins, or arcs, cell, library cells, designs, nets, net segments, and blocks within the design. In general, variations can be assigned to any design abstraction that can be recognized with static timing and power analysis tools.

In one embodiment of the present invention, library model accuracy can be evaluated by one or more of: RMS error; max absolute error; max relative error; expected absolute error; and expected relative error.

In one embodiment of the present invention, library sample points and distributions can be used to automatically derive corner libraries or corner equivalent settings. This eliminates the need for characterization of corner libraries. This process is referred to as "auto-cornering." Note that auto-cornering process can also be used for parasitics.

One embodiment of the present invention uses corners to model the effects of some parameters, while using statistical analysis techniques to model the effects of other parameters. Note that statistical analysis can be performed around any fixed point in the PVT space.

One embodiment of the present invention uses both statistical analysis techniques and derating/scaling techniques to model variations.

In one embodiment of the present invention, two sampling points are needed for each parameter. Hence, two instances of the library data (i.e., one for each library sampling point excluding the typical/nominal point) are generated per parameter. For example, if there are 3 parameters, 7 instances of the library data are needed (i.e., 2N+1 instances of the library data, where N is the number of parameters). Note that the number of library sampling points per parameter can be more or fewer depending on the application. In one embodiment of the present invention, while generating the instances of the library data for each parameter, the values for the other parameters are set to their nominal values.

Figure 8:
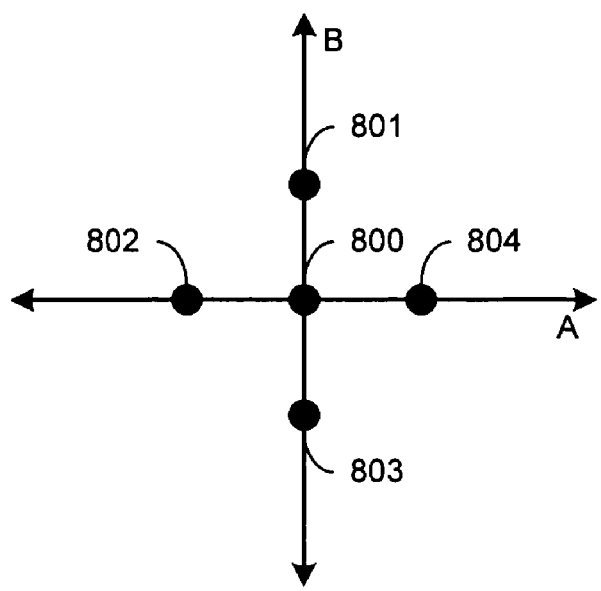
FIG. 8 illustrates two parameters and a number of library sampling points in accordance with an embodiment of the present invention.

FIG. 8 illustrates two parameters, A and B, and library sampling points 800-804 in accordance with an embodiment of the present invention. Library sampling point 800 is at the nominal values for parameters A and B. Library sampling point 804 is at the nominal value for parameter B, but parameter A is set to a value that is not the nominal value. In one embodiment of the present invention, library sampling point 804 is sampled so that the value of parameter A is one standard deviation away from the nominal value in the positive direction. Library sampling point 801 is at the nominal value for parameter A, but parameter B is set to a value that is not the nominal value. In one embodiment of the present invention, library sampling point 801 is sampled so that the value of parameter B is one standard deviation from the nominal value in the positive direction. Library sampling point 802 is at the nominal value for parameter B, but parameter A is set to a value that is not the nominal value. In one embodiment of the present invention, library sampling point 802 is sampled so that the value of parameter A is one standard deviation from the nominal value in the negative direction. Library sampling point 803 is at the nominal value for parameter A, but parameter B is set to a value that is not the nominal value. In one embodiment of the present invention, library sampling point 803 is sampled so that the value of parameter B is one standard deviation from the nominal value in the negative direction.

In other embodiments of the present invention, for a given library sampling point, both parameters A and B are set such that neither parameter is at the nominal value.

Figure 9:
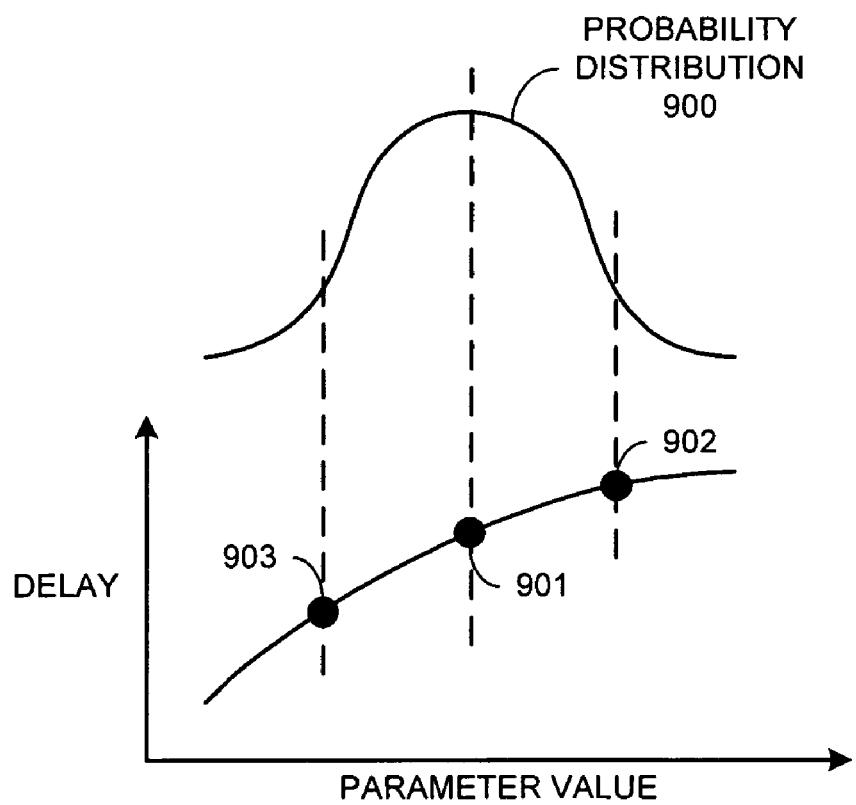
FIG. 9 illustrates the dependence of the cell delay on a parameter value in accordance with an embodiment of the present invention.

FIG. 9 illustrates the dependence of the cell delay on a parameter value in accordance with an embodiment of the present invention. The parameter illustrated in FIG. 9 has a probability distribution 900. In order to model the delay for the component, the parameter is sampled at two or more points. Point 901 is at the nominal value of the parameter whereas points 902-903 are at non-nominal values. In one embodiment of the present invention, points 902-903 are one standard deviation from the nominal value in the positive and negative direction, respectively.

In one embodiment of the present invention, points 902-903 are used in interpolation and extrapolation for approximating the delay as a function of probability distribution 900. In another embodiment of the present invention, points 901-902 are used in a piecewise-linear interpolation and extrapolation for approximating the delay as a function of probability distribution 900.

Sampling Parameters

Figure 10:
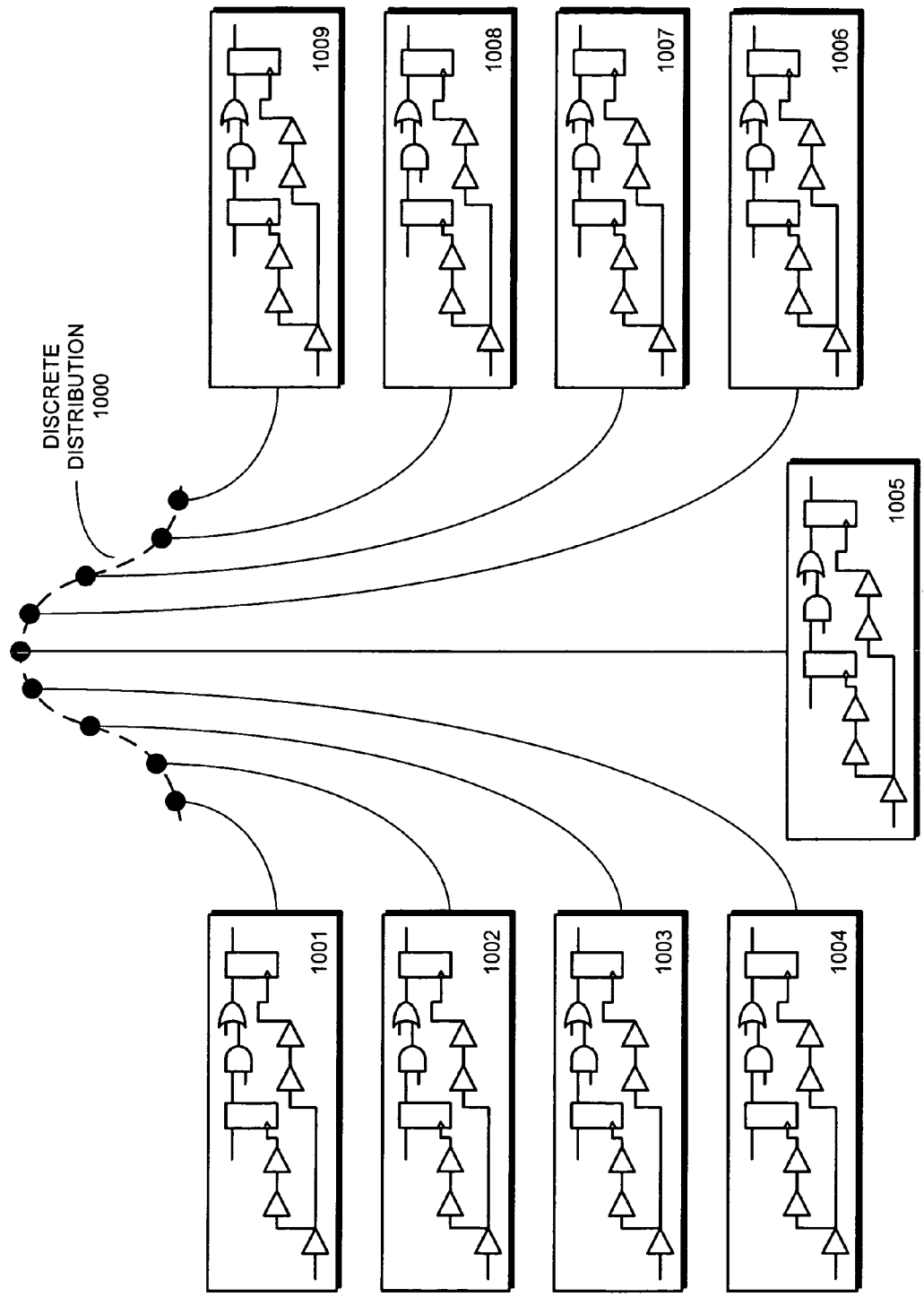
FIG. 10 illustrates a number of die samples used to represent a discrete distribution of parameter values in accordance with an embodiment of the present invention.

FIG. 10 illustrates a number of die samples used to represent a discrete distribution 1000 of parameter values in accordance with an embodiment of the present invention. In one embodiment of the present invention, parameters are sampled and assigned to devices across a number of dies. For example, in FIG. 10, dies 1001-1009 are created by sampling parameter values across discrete distribution 1000. In each of the dies, the parameter values are fixed to specified values (i.e., there is no distribution information for the parameters on any given die). As a result, the timing analysis for a given die is deterministic. The aggregate timing results for dies 1001-1009 produces a distribution of timing results that represent the effects of discrete distribution 1000 of parameter values. One embodiment of the present invention uses the parameter values and the libraries to calculate delays for each sample.

One embodiment of the present invention handles correlations between parameters (e.g., shared paths, spatial distribution, etc.) using sampling to decouple die creation from propagation and delay calculation.

Consider a path that includes devices A and B, wherein device A feeds into device B. Assume that there is only one parameter len and one timing arc per device. Samples dies are created for the parameter distributions, wherein each sample contains devices A and B. For example, if there are n dies, the following annotations are used: len[1 ... n][A ... B]. Furthermore, other parameters used in the delay calculation are stored similarly: slew[1 ... n][A ... B], load[1 ... n][A ... B].

In one embodiment of the present invention, the delay is a function of a slew, load, and len:

delay=$f$(slew, load, len), where each <slew, load, len> is a named sample.

For each sample (i=1 to n), the delays and the slews are computed:

delay$_i$=$f$(slew$_i$, load$_i$, len$_{plus}$)

delay$_i$=$f$(slew$_i$, load$_i$, len$_{typ}$)

delay$_i$=$f$(slew$_i$, load$_i$, len$_{minus}$)

slew$_i$=$f$(slew$_i$, load$_i$, len$_{plus}$)

slew$_i$=$f$(slew$_i$, load$_i$, len$_{typ}$)

slew$_i$=$f$(slew$_i$, load$_i$, len$_{minus}$)

For example, in FIG. 9, point 903 can correspond to len$_{minus}$, point 901 can correspond to len$_{typ}$, and point 902 can correspond to len$_{plus}$.

Next, len is sampled for each device or timing arc, and the delays and/or slews are computed using linear (or piecewise-linear) interpolation:

$$\text{delay}(\text{slew}_i, \text{load}_i, \text{len}_i) = \text{delay}(\text{slew}_i, \text{load}_i, \text{len}_{typ}) + (\text{delay}(\text{slew}_i, \text{load}_i, \text{len}_{plus}) - \text{delay}(\text{slew}_i, \text{load}_i, \text{len}_{minus})) * (\text{len}_i - \text{len}_{typ})/(\text{len}_{plus} - \text{len}_{minus}) \quad (1)$$

Note that this formula illustrates using two points to perform interpolation and extrapolation for approximating delays. In another embodiment of the present invention, while calculating delays and/or slews, non-linear scaling of current-based models is used.

In one embodiment of the present invention, if there is no correlation between parameters, the distribution of len is sampled independently. Note that there is no need to store the samples; they can be created on-the-fly. In one embodiment of the present invention, if there is correlation between parameters, correlated samples are created, wherein the correlated samples are shared between all computations.

For example, assume that len is made up of two components: len$_1$ and len$_2$. Moreover, assume that len$_1$ is an inter-die parameter and len$_2$ is an intra-die parameter. Since inter-die components are fully correlated within a given die, len$_1$ is sampled and shared with all devices on the die. On the other hand, len$_2$ is sampled independently for each device on the die.

Figure 11:
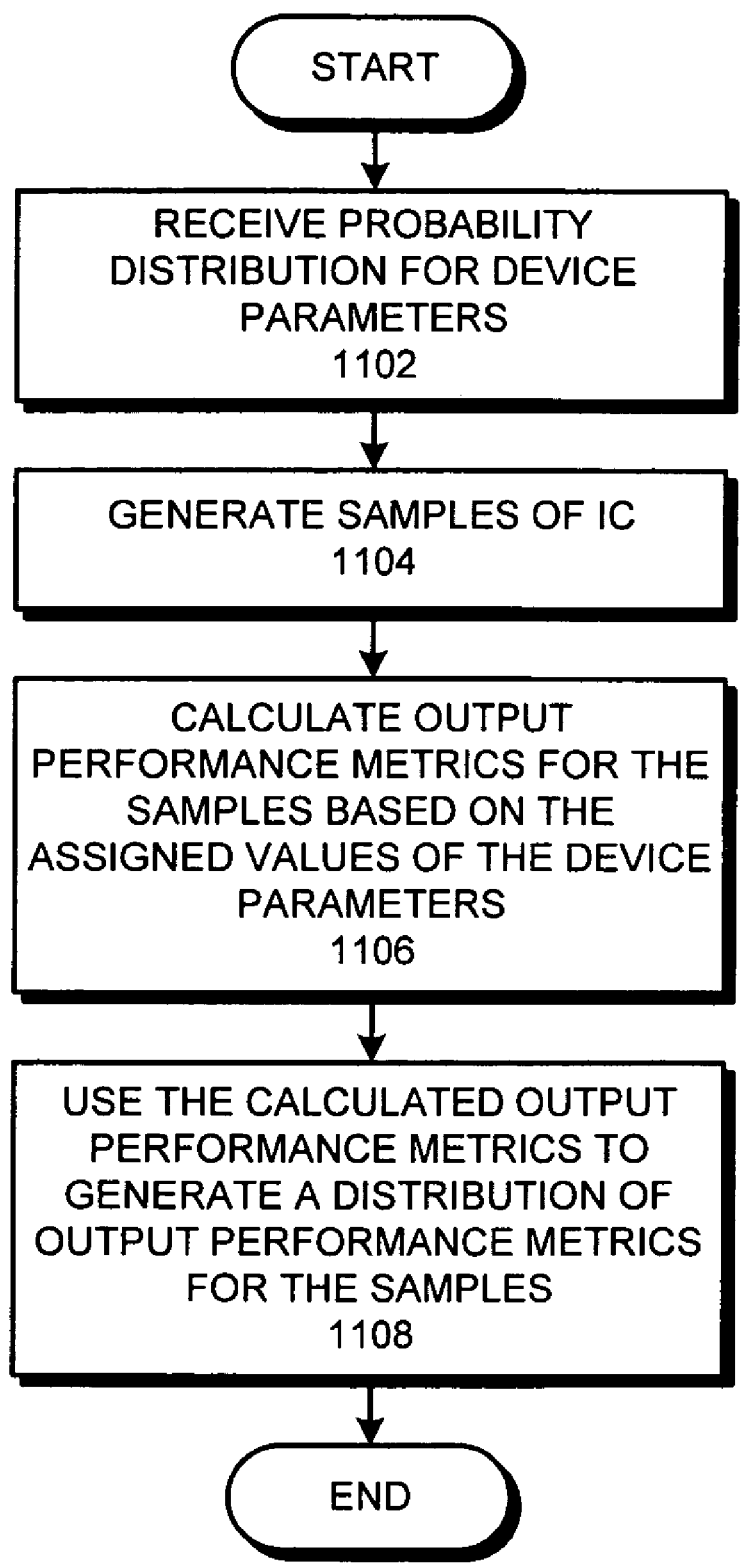
FIG. 11 presents a flow chart illustrating the process of determining the performance of an IC in accordance with an embodiment of the present invention.

FIG. 11 presents a flow chart illustrating the process of determining the performance of an IC in accordance with an embodiment of the present invention. The process begins when the system receives probability distributions for parameters for the IC (step 1102). Next, the system generates samples of the IC, wherein while generating a given sample, the system uses the probability distributions to assign values to the parameters for components within the IC (step 1104). The system then calculates output performance metrics for the samples based on the assigned values of the parameters (step 1106) and uses the calculated output performance metrics to generate a distribution of output performance metrics for the samples (step 1108).

In one embodiment of the present invention, a single analysis is performed to calculate the output performance metrics. Unlike the Monte Carlo Technique which performs one STA run per sample, the present invention performs a single analysis across all of the samples, and hence, does not incur the overhead of performing multiple STA runs. The reason that the present invention can perform a single analysis to calculate the output performance metrics for all samples is illustrated in equation (1) above. For a given component within a sample, the some of the parameter values are fixed (i.e., len$_{typ}$, len$_{minus}$, and len$_{plus}$ are specified values in the library data that never change between samples). Other parameters, such as slew$_i$, load$_i$, and len$_i$ may change from sample to sample. Since a distribution function indicates the frequency at which a given value in the distribution is observed, a given set of parameter values for an instance of a component can be observed more than one time. For example, the value of 7 for len$_i$ can have a frequency of 15, whereas the value of 1 for len$_i$ can have a frequency of 2. Hence, if the delay function for a component has been calculated for a given set of parameter values (e.g., {slew$_1$, load$_1$, len$_1$}) and if the given set of parameter values is seen again in another sample (or within the same sample), the previously-calculated delay value is used instead of recalculating the delay value.

Note that small deviations in the device parameters can produce negligible changes in the slews and the loads. Hence, in one embodiment of the present invention, if a given set of parameter values (e.g., {slew$_1$, load$_1$, len$_1$}) is within specified values of a previously seen set of parameter values (e.g., {slew$_2$, load$_2$, len$_2$}), the calculated delay for the previously-seen set of parameters is used in lieu of calculating the delay as a function of the given set of parameter values. Hence, the number of calculations performed by the analysis can be further reduced.

In one embodiment of the present invention, during the process of calculating the output performance metrics across the samples, the data for each sample is not mixed with other samples. In other words, the scalar values, and not the distribution functions, for the output performance metrics are being propagated. Hence, performing max operations is straightforward. In contrast, if the distribution functions are propagated through the components within the samples, a convolution must be performed to generate the resulting distribution function at the output of each component. Unfortunately, the convolution operation is computationally expensive. Hence, the present invention avoids this computationally-expensive operation.

Note that the discussion above refers to the delay function in equation (1). However, the delay function in equation (1) and the optimizations to the calculation of the delay function can be applied to any output performance metric.

In one embodiment of the present invention, annotations can be used. For example, information about output performance metrics can be annotated from other analysis tools.

In one embodiment of the present invention, the system predicts a probability of failure for a manufactured IC by: identifying paths that do not meet specified requirements for the output performance metrics; obtaining discrete distribution functions for the identified paths; and performing a statistical minimum function for the discrete distributions for the paths to produce a minimum distribution function, which indicates the probability of failure for the manufactured IC.

Power

In one embodiment of the present invention, static leakage is computed for each device within a sample. In one embodiment of the present invention, dynamic power is computed by feeding the samples into power analysis.

Signal Integrity

In one embodiment of the present invention, crosstalk delay is computed by feeding the samples into a signal integrity analysis tool.

In one embodiment of the present invention, timing windows are calculated as continuous unified probability distributions. In this embodiment, a timing window is calculated from signal switching probabilities. In another embodiment of the present invention, a timing window is calculated from two early/late probability distributions. In this embodiment, the timing window is computed out of statistical analysis of base delays.

In one embodiment of the present invention, overlap of timing windows is calculated as overlap quantile of two distributions.

Path Selection

One embodiment of the present invention selects a path from a regular corner. For example, a corner-based derating technique can be used. Note that a combination of statistical techniques and derating can be used for path-based analysis at a later stage.

One embodiment of the present invention selects a path from auto cornering. For example, a corner-based derating technique can be used for path-based analyses.

One embodiment of the present invention selects a path from a modified corner. For example, the corner can be a corner with a min/max for process parameters only.

One embodiment of the present invention selects a path from a quantile-based slack driven report.

One embodiment of the present invention selects backwards paths using probability-based selection.

Reporting

One embodiment of the present invention generates reports from corner analysis and improvement results together. Another embodiment of the present invention generates reports from statistical analysis. For example, the reports can include quantiled delay, slack, slew, and power data. Another embodiment of the present invention provides sensitivity and criticality reports.

One embodiment of the present invention provides regular reporting with corner values and improved results.

One embodiment of the present invention provides reporting with quantiled results.

One embodiment of the present invention provides sensitivity and criticality reports. In a variation on this embodiment, endpoints and paths can be filtered by corner slack. In another variation on this embodiment, the results can be sorted by endpoint or path slack sensitivity. In another variation on this embodiment, the results can be sorted by device, net, timing arcs.

In one embodiment of the present invention, a report can include one or more of: a plot of the distribution of the calculated delays; the mean of the calculated delays; the standard deviation of the calculated delays; the sensitivity of the calculated delays; the value of the delay at a specified quantile; and the probability that the delay is at a specified value.

Fixing

One embodiment of the present invention supports existing fixing techniques that are based on path, pin arrival time, required time, and slack values from signoff analysis. For example, quantiled values (e.g., $99^{th}$ percentile) can be treated as corner values (e.g., fast corner).

One embodiment of the present invention uses existing fixing flows but provides quantiled values. Another embodiment of the present invention first fixes significant variation sources by sensitivity analysis, and then fixes variation sources by violations in the quantiled slack. In either embodiment, if the fixing tool is not the same tool as statistical analysis tool, a reduced derating technique is used.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for determining a performance of an integrated circuit (IC), comprising:

receiving probability distributions for parameters for the IC;

generating samples of the IC, wherein generating a given sample involves using the probability distributions to assign values to the parameters for components within the IC;

calculating by computer output performance metrics for the samples based on the assigned values of the parameters; and using the calculated output performance metrics to generate a distribution of output performance metrics for the samples.

2. The method of claim 1,
wherein the probability distributions are discrete distributions; and
wherein discretization points for parameters are associated with the samples.

3. The method of claim 2,
wherein a single analysis is used to calculate the output performance metrics for the samples; and
wherein data from a given sample is not mixed with data from other samples.

4. The method of claim 2, wherein the method further comprises adjusting the discretization to achieve a specified accuracy and a specified performance.

5. The method of claim 1, wherein the output performance metrics include one or more of:
delay;
slew;
noise;
power;
signal integrity;
arrival time;
required time; and
slack.

6. The method of claim 1, wherein the method further comprises generating a report which includes one or more of:
calculating signal integrity metrics for the samples based on the assigned values of the parameters; and
using the signal integrity metrics to generate a distribution of signal integrity metrics for the samples.

7. The method of claim 1, wherein the method further comprises:
calculating noise metrics for the samples based on the assigned values of the parameters; and
using the noise metrics to generate a distribution of noise metrics for the samples.

8. The method of claim 1, wherein the method further comprises:
calculating power metrics for the samples based on the assigned values of the parameters; and
using the power metrics to generate a distribution of power metrics for the samples.

9. The method of claim 1, wherein the method further comprises generating a report which includes one or more of:
a plot of a distribution of the input parameters;
a mean of the input parameters;
a standard deviation of the input parameters;
a sensitivity of the input parameters;
a value of the input parameters at a specified quantile;
a plot of the distribution of the calculated output performance metrics;
a mean of the calculated output performance metrics;
a standard deviation of the calculated output performance metrics;
a sensitivity of the calculated output performance metrics;
a value of the output performance metric at a specified quantile;
a probability that the output performance metric is at, above, or below a specified value; and
any other report metric.

10. The method of claim 1, wherein, the method further comprises:
receiving one or more of properties of the parameters, wherein the one or more properties includes:
variational constraints for the parameters;
auto-correlations for the parameters;
cross-correlations for the parameters;
spatial correlations for the parameters;
a mean shift of the parameter for each device or interconnect;
a sensitivity of devices to the parameters;
a sensitivity of interconnects to the parameters; and
any other property of a parameter; and
generating the samples of the IC using the probability distribution and the one or more properties of the parameters.

11. The method of claim 10, wherein a variational constraint for the parameters includes one or more of:
an input delay;
an output delay;
a setup constraint;
a hold constraint;
a clock insertion delay;
a clock skew;
a clock uncertainty; and
any other variational constraint.

12. The method of claim 10, wherein a spatial correlation includes:
a grid-based correlation;
a map-based correlation;
a distance-based correlation; and
any other type of spatial correlation.

13. The method of claim 10, wherein the sensitivity of devices to the parameters includes one or more of sensitivities to:
delay;
slew;
capacitance;
signal bump height;
signal bump width;
leakage current;
drive resistance;
output current; and
any other sensitivity parameter.

14. The method of claim 10, wherein the sensitivity of interconnect to the parameters includes one or more of sensitivities to:
metal thickness;
metal width;
metal spacing;
interlayer dielectric thickness;
contact size;
via size;
temperature; and
any other sensitivity parameter.

15. The method of claim 10, wherein sensitivities to device and/or interconnect variations are specified for one or more of:
rising timing arcs for devices;
falling timing arcs for devices;
linear model;
piece-wise linear model;
slew-segmented linear;
slew-segmented piece-wise linear;
load-segmented linear; and
load-segmented piece-wise linear.

16. The method of claim 1, wherein the parameters are applied to components of the IC within one or more of:
a timing arc;
a cell;
an interconnect segment;
a set of timing arcs;

a set of cells;
a set of interconnect segments;
a portion of the IC which includes cells and interconnect; and
any other component of the IC.

17. The method of claim 1, wherein the probability distributions includes one or more of:
a normal distribution;
a log-normal distribution;
a uniform distribution;
a constant distribution;
a multiple discrete value distribution;
a piecewise-linear distribution;
an empirical distribution; and
any other probability distribution.

18. The method of claim 1, wherein the parameters includes one or more of:
metal parameters;
transistor parameters;
dielectric parameters; and
any other device parameter.

19. The method of claim 1, wherein annotations are used.

20. The method of claim 1, further comprising predicting a probability of failure for a manufactured IC by:
identifying paths that do not meet specified requirements for the output performance metrics;
obtaining discrete distribution functions for the identified paths; and
performing a statistical minimum function for the discrete distribution functions for the paths to produce a minimum distribution function, which indicates the probability of failure for the manufactured IC.

21. A computer-readable storage medium storing instructions that when executed by a computer cause the computer to perform a method for determining a performance of an integrated circuit (IC), wherein the method comprises:
receiving probability distributions for parameters for the IC;
generating samples of the IC, wherein generating a given sample involves using the probability distributions to assign values to the parameters for components within the IC;
calculating output performance metrics for the samples based on the assigned values of the parameters; and
using the output performance metrics to generate a distribution of output performance metrics for the samples.

22. The computer-readable storage medium of claim 21, wherein the probability distributions are discrete distributions; and
wherein discretization points for parameters are associated with the samples.

23. The computer-readable storage medium of claim 22, wherein a single analysis is used to calculate the output performance metrics for the samples; and
wherein data from a given sample is not mixed with data from other samples.

24. The computer-readable storage medium of claim 22, wherein the method further comprises adjusting the discretization to achieve a specified accuracy and a specified performance.

25. The computer-readable storage medium of claim 21, wherein the output performance metrics include:
delay; and
slew.

26. The computer-readable storage medium of claim 21, wherein the method further comprises calculating one or more of:
noise;
power;
signal integrity;
arrival time;
required time; and
slack.

27. The computer-readable storage medium of claim 21, wherein the method further comprises:
calculating noise metrics for the samples based on the assigned values of the parameters; and
using the noise metrics to generate a distribution of noise metrics for the samples.

28. The computer-readable storage medium of claim 21, wherein the method further comprises:
calculating power metrics for the samples based on the assigned values of the parameters; and
using the power metrics to generate a distribution of power metrics for the samples.

29. The computer-readable storage medium of claim 21, wherein the method further comprises generating a report which includes one or more of:
a plot of a distribution of the input parameters;
a mean of the input parameters;
a standard deviation of the input parameters;
a sensitivity of the input parameters;
a value of the input parameters at a specified quantile;
a plot of the distribution of the calculated output performance metrics;
a mean of the calculated output performance metrics;
a standard deviation of the calculated output performance metrics;
a sensitivity of the calculated output performance metrics;
a value of the output performance metrics at a specified quantile;
a probability that the output performance metrics is at, above, or below a specified value; and
any other report metric.

30. The computer-readable storage medium of claim 21, wherein, the method further comprises:
receiving one or more of properties of the parameters, wherein the one or more properties includes:
variational constraints for the parameters;
auto-correlations for the parameters;
cross-correlations for the parameters;
spatial correlations for the parameters;
a mean shift of the parameter for each device or interconnect;
a sensitivity of devices to the parameters;
a sensitivity of interconnects to the parameters; and
any other property of a parameter; and
generating the samples of the IC using the probability distribution and the one or more properties of the parameters.

31. The computer-readable storage medium of claim 30, wherein a variational constraint for the parameters includes one or more of:
an input delay;
an output delay;
a setup constraint;
a hold constraint;
a clock insertion delay;
a clock skew;
a clock uncertainty; and
any other variational constraint.

32. The computer-readable storage medium of claim 30, wherein a spatial correlation includes:

a grid based correlation;
a map based correlation;
a distance based correlation; and
any other type of spatial correlation.

33. The computer-readable storage medium of claim 30, wherein the sensitivity of devices to the parameters includes one or more of sensitivities to:
  delay;
  slew;
  capacitance;
  signal bump height;
  signal bump width;
  leakage current;
  drive resistance;
  output current; and
  any other sensitivity parameter.

34. The computer-readable storage medium of claim 30, wherein the sensitivity of interconnect to the parameters includes one or more of sensitivities to:
  metal thickness;
  metal width;
  metal spacing;
  interlayer dielectric thickness;
  contact size;
  via size;
  temperature; and
  any other sensitivity parameter.

35. The computer-readable storage medium of claim 30, wherein sensitivities to device and/or interconnect variations are specified for one or more of:
  rising timing arcs for devices;
  falling timing arcs for devices;
  linear model;
  piece-wise linear model;
  slew-segmented linear;
  slew-segmented piece-wise linear;
  load-segmented linear; and
  load-segmented piece-wise linear.

36. The computer-readable storage medium of claim 21, wherein the parameters are applied to components of the IC within one or more of:
  a timing arc;
  a cell;
  an interconnect segment;
  a set of timing arcs;
  a set of cells;
  a set of interconnect segments; and
  a portion of the IC which includes cells and interconnect; and
  any other component of the IC.

37. The computer-readable storage medium of claim 21, wherein the probability distributions includes one or more of:
  a normal distribution;
  a log-normal distribution;
  a uniform distribution;
  a constant distribution;
  a multiple discrete value distribution;
  a piecewise-linear distribution;
  an empirical distribution; and
  any other probability distribution.

38. The computer-readable storage medium of claim 21, wherein the parameters includes one or more of:
  metal parameters;
  transistor parameters;
  dielectric parameters; and
  any other device parameter.

39. The computer-readable storage medium of claim 21, wherein annotations are used.

40. The computer-readable storage medium of claim 21, further comprising predicting a probability of failure for a manufactured IC by:
  identifying paths that do not meet specified requirements for the output performance metrics;
  obtaining discrete distribution function for the identified paths; and
  performing a statistical minimum function for the discrete distribution functions for the paths to produce a minimum distribution function, which indicates the probability of failure for the manufactured IC.

41. An apparatus that determines a performance of an integrated circuit (IC), comprising:
  a receiving mechanism configured to receive probability distributions for parameters for the IC;
  a sample generation mechanism configured to generate samples of the IC, wherein for a given sample, the sample generation mechanism is configured to use the probability distribution to assign values to the parameters for components within the IC;
  a timing analysis mechanism configured to calculate output performance metrics for the samples based on the assigned values of the parameters; and
  a distribution generation mechanism configured to use the calculated output performance metrics to generate a distribution of output performance metrics for the samples.

* * * * *

UNITED STATES PATENT AND TRADEMARK OFFICE
CERTIFICATE OF CORRECTION

PATENT NO. : 7,650,580 B2 Page 1 of 1
APPLICATION NO. : 11/644563
DATED : January 19, 2010
INVENTOR(S) : Kucukcakar et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 435 days.

Signed and Sealed this

Twenty-eighth Day of December, 2010

David J. Kappos
*Director of the United States Patent and Trademark Office*